United States Patent
Coutu, Jr. et al.

(10) Patent No.: US 7,601,554 B1
(45) Date of Patent: Oct. 13, 2009

(54) SHAPED MEMS CONTACT

(75) Inventors: Ronald A. Coutu, Jr., Beavercreek, OH (US); Paul E. Kladitis, New Carlisle, OH (US); Robert L. Crane, Kettering, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 430 days.

(21) Appl. No.: 11/047,345

(22) Filed: Jan. 31, 2005

(51) Int. Cl.
*H01L 21/00* (2006.01)
(52) U.S. Cl. .................. 438/48; 200/181; 257/E21.001
(58) Field of Classification Search .................. 438/48, 438/52; 200/181
See application file for complete search history.

(56) References Cited

U.S. PATENT DOCUMENTS

| | | | |
|---|---|---|---|
| 5,597,064 | A | 1/1997 | Ozaki et al. |
| 6,373,007 | B1 | 4/2002 | Calcatera et al. |
| 6,624,498 | B2 | 9/2003 | Filas et al. |
| 6,655,964 | B2 | 12/2003 | Fork et al. |
| 6,793,753 | B2 | 9/2004 | Unger et al. |
| 2003/0116417 | A1 | 6/2003 | DeReus |
| 2003/0116848 | A1 | 6/2003 | Cunningham et al. |
| 2003/0117257 | A1 | 6/2003 | Cunningham |
| 2003/0155643 | A1 | 8/2003 | Freidhoff |
| 2003/0184419 | A1* | 10/2003 | Ma .............................. 335/78 |
| 2003/0223174 | A1 | 12/2003 | Prophet |
| 2003/0230798 | A1 | 12/2003 | Lin et al. |
| 2004/0012298 | A1 | 1/2004 | Cunningham et al. |
| 2004/0016995 | A1 | 1/2004 | Kuo et al. |
| 2004/0067604 | A1 | 4/2004 | Ouellet et al. |

OTHER PUBLICATIONS

S. Majumder et al, "MEMS Switches", IEEE Instrumentation & Measurement Magazine, Mar. 2003, pp. 12-15.
S. Duffy et al., "MEMS Microswitches for Reconfigurable Microwave Circuitry", IEEE Microwave and Wireless Components Letters, Mar. 2001, pp. 106-108, vol. 11.
J. Schimkat, "Contact Measurements Providing Basic Design Data for Microrelay Actuators", Sensors and Actuators, 1999, pp. 138-143, vol. 73.
Ronald Coutu et al., "Selecting Metal Alloy Electric Contact Materials for MEMS Switches", Journal of Micromechanics and Microengineering, 2004, pp. 1157-1164, vol. 14.

* cited by examiner

*Primary Examiner*—Jack Chen
(74) *Attorney, Agent, or Firm*—AFMCLO/JAZ; Gerald B. Hollins

(57) ABSTRACT

A MEMS switch fabrication process and apparatus inclusive of a bulbous rounded surface movable contact assembly that is integral with the switch movable element and achieving of long contact wear life with low contact electrical resistance. The disclosed process is compatible with semiconductor integrated circuit fabrication materials and procedures and includes an unusual photoresist reflow step in which the bulbous contact shape is quickly defined in three dimensions from more easily achieved integrated circuit mask and etching-defined precursor shapes. A plurality of differing photoresist materials are used in the process. A large part of the contact and contact spring formation used in the invention is accomplished with low temperature processing including electroplating. Alternate processing steps achieving an alloy metal contact structure are included. Use of a subroutine of processing steps to achieve differing but related portions of the electrical contact structure is also included.

14 Claims, 3 Drawing Sheets

SHAPED MEMS CONTACT

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the and commonly assigned patent document "RADIO FREQUENCY MEMS SWITCH CONTACT METAL SELECTION", AFD 707, Ser. No. 11/047,344; now U.S. Pat. No. 7,235,750. The contents of this somewhat related application are hereby incorporated by reference herein.

BACKGROUND OF THE INVENTION

Radio frequency switches are used in many aspects of present day communication systems and radar systems including for example in cellular telephones and phased array radar antennas. Today, such radio frequency switching is often accomplished with the use of solid-state devices such as Field Effect Transistors and PIN diodes or with macro sized metal-to-metal contact switches or relays. Such solid state devices are often small and easily integrated with other radio frequency components but provide relative poor electrical performance. In contrast the larger in size Macro switches offer relatively good electrical performance including isolation measuring greater than 70 decibels, insertion losses near 0.07 decibels and contact resistances of less than one ohm however such switches are bulky and not easily integrated with many radio frequency components.

One solution to these difficulties is provided by the micro-sized or microelectromechanical or MEMS metal contact switch. Such MEMS switches may be fabricated using the same fabrication processes as is used in realizing solid-state devices. The size of these switches makes them easily integrated with radio frequency components and additionally, because they are mechanical devices, such switches provide relatively good radio frequency performance including isolation greater than 20 decibels and insertion losses near 0.1-0.5 decibels. Although the MEMS switches of the present invention are viewed as being primarily useful at radio frequencies the described structure and method are not limited to such usage and may indeed find application in any frequency range between direct current and signals in the gigahertz range.

Radio frequency MEMS metal contact switches have been fabricated and tested by industry, government laboratories, and academia. The upper electric contact area for previous switches has been "plug-shaped" with a flat bottom. Flat upper electric contacts are, however, not easily cleaned, have inconsistent wear patterns, and do not allow for switch operation at different areas on the contact surface.

This invention provides a way of implementing a "hemispherical-shaped" upper electric contact geometry into micro-switch fabrication and includes defining the upper contacts in a sacrificial layer using standard photolithography. The resulting electric contact geometry is then re-flowed in an oven to reform, by surface tension, the "plug-shaped" contact into a "hemispherical-shaped" contact. This allows for reliable contact cleaning (i.e. mechanical wiping) and consistent metal-to-metal contact with each switch actuation and also allows the switch to be operated at different areas on the contact surface by varying the switch actuation voltage.

SUMMARY OF THE INVENTION

The present invention provides a low cost easily fabricated metallic electrical contact assembly especially suited for use in a radio frequency microelectromechanical switch.

It is therefore an object of the present invention to provide an integral microelectromechanical switch element inclusive of both spring and electrical contact portions.

It is another object of the invention to provide a procedure useful in the fabrication of a microelectromechanical switch element having integral spring and electrical contact portions.

It is another object of the invention to provide an electrical contact shape for a radio frequency MEMS switch that is compatible with fabrication of the switching mechanism of the switch.

It is another object of the invention to provide an improved shape for the upper contact in a radio frequency MEMS switch.

It is another object of the invention to provide integrated circuit process-compatible fabrication of microelectromechanical switch elements.

It is another object of the invention to provide a photoresist-based process for fabrication of microelectromechanical switch elements.

It is another object of the invention to provide a process for fabrication of microelectromechanical switch elements that is based on use of a photoresist material that is heat responsive and solvent responsive.

It is another object of the invention to provide a photoresist reflow-based process for fabrication of microelectromechanical switch element.

It is another object of the invention to provide a deposited metal-based process for fabrication of microelectromechanical switch elements.

It is another object of the invention to provide a microelectromechanical switch arrangement having desirable immunity to mechanical stiction and other switch mechanism difficulties.

It is another object of the invention to provide a microelectromechanical switch arrangement providing desirably low electrical contact resistance.

It is another object of the invention to provide a microelectromechanical switch arrangement providing desirable contact resistance to mechanical wear.

It is another object of the invention to provide a MEMS switch upper contact that is more easily cleaned by normal contact use wiping action.

It is another object of the invention to enable use of a flat bottom upper contact in a MEMS switch.

It is another object of the invention to provide a MEMS switch upper contact that achieves a consistent wear pattern.

It is another object of the invention to provide a microelectromechanical switch arrangement inclusive of metal alloy materials in the spring and contact portions thereof.

These and other objects of the invention will become apparent as the description of the representative embodiments proceeds.

These and other objects of the invention are achieved by the method of making electrical contact elements for a radio frequency MEMS contact switch, said method comprising the steps of:

fabricating a metallic anchor member, a metallic contact actuation electrode and a metallic lower contact support element for said radio frequency MEMS radio frequency contact switch on a surface of an insulating substrate member;

covering said metallic anchor member, said contact actuation electrode and said metallic lower contact support element with a layer of sacrificial photoresist material;

forming selectively configured anchor member and rectangularly configured moveable contact member precursor perturbations in said layer of sacrificial photoresist material;

reflowing said layer of sacrificial photoresist material selectively configured anchor member and rectangularly configured movable contact member precursor perturbations into sloping sidewall and curving corner cross section shapes respectively by applying thereto an elevated temperature sequence having selected time and temperature magnitudes;

covering said layer of sacrificial photoresist material including said curving corner cross section precursor perturbations with a layer of intimately contacting movable contact-supporting metal of selected lateral extent;

said selected lateral extent layer of movable contact-support metal including both a contact metal anchoring portion received on said selectively configured anchor member and a bulbous movable contact portion each formed within said upper contact member precursor perturbations of said sacrificial photoresist material during said covering step;

releasing said layer of intimately contacting movable contact-support metal and said bulbous movable contact portion from said intimately contacting state with said layer of sacrificial photoresist material, said releasing enabling electrical movement control of said contact-support metal with said bulbous upper contact portion by influence of said contact actuation electrode.

BRIEF DESCRIPTION OF THE DRAWINGS

The accompanying drawings incorporated in and forming a part of the specification, illustrate several aspects of the present invention and together with the description serve to explain the principles of the invention. In the drawings.

DETAILED DESCRIPTION OF THE INVENTION

Figure 1A:
FIG. 1a shows a substrate member usable in a repeating sequence part of a present invention process.
Figure 1B:
FIG. 1b shows a substrate with photoresist films usable in a repeating sequence part of a present invention process.

FIG. 1 in the drawings shows a sequence of steps usable to form a number of physical portions of a MEMS switch assembly and its electrical contacts in according with the present invention. In the FIG. 1 drawings a plurality of steps as appear in the views of FIG. 1A through FIG. 1F are employed in a sequence that is used multiple times in a switch and contact formation process. In a certain sense therefore the FIG. 1 sequence of steps may be likened to a subroutine in a computer program, a subroutine that is called into execution multiple times by a higher-level routine.

The FIG. 1 sequence commences with a substrate 100 that is composed of for example sapphire and that has been cleaned with a known buffered oxide etch, isopropyl alcohol and acetone sequence. The substrate 100 may have a thickness in the range of 500 nanometers, a surface roughness of 100 angstroms and may be supported on a vacuum chuck fixture during the FIG. 1 processing. This substrate 100 is covered with a first layer 102 of photoresist preferably of the PMGI type and a second layer 104 of photoresist preferably of the 1813 type as is represented in the FIG. 1b drawing. These two different photoresist materials are desired because their use enables achievement of the overhang appearing in FIG. 1e. The photoresist layers may have layer thicknesses in the range of 1000 to 1500 angstroms and 2000 to 3000 angstroms respectively. Such thickness may be determined by spin rate control. Curing of the photoresist layers 102 and 104 may be accomplished with a hot plate bake. The PMGI and 1813 photoresist materials are commonly used in integrated circuit processing and are available from MicroChem Corporation of Newton, Mass. and Rohm and Haas (Shipley) of Philadelphia, Pa. respectively for example.

Figure 1C:
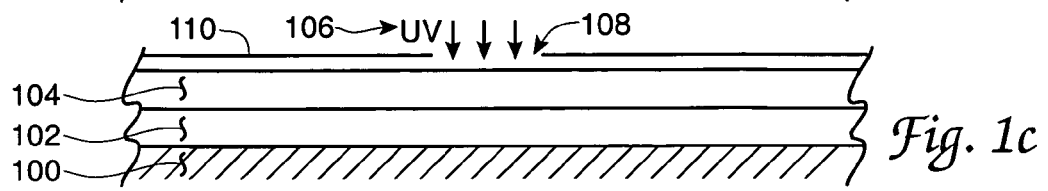
FIG. 1c shows a substrate with photoresist films and mask usable in a repeating sequence part of a present invention process.
Figure 1D:
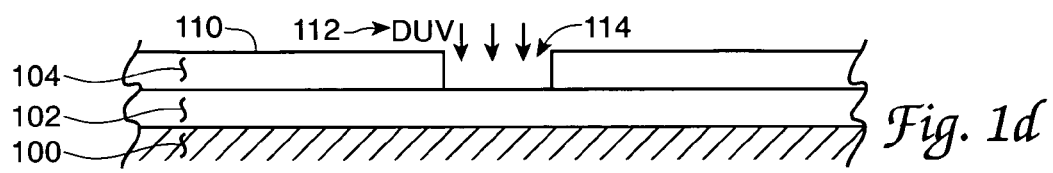
FIG. 1d shows a substrate with a partially removed photoresist film usable in a repeating sequence part of a present invention process.
Figure 1E:
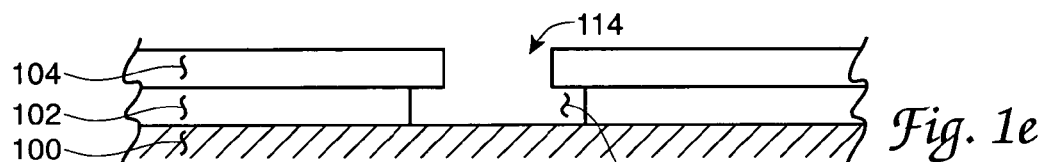
FIG. 1e shows a substrate with two partially removed photoresist films usable in a repeating sequence part of a present invention process.

In the FIG. 1c drawing a mask 110 having one or more apertures 108 disposed therein is used to define an area of the photoresist layer 104 to be exposed to ultraviolet light 106. For the 1000 to 1500 angstroms thickness film of 1813 photoresist in the layer 104, an exposure time of 4 to 5 seconds may be used for this FIG. 1c step. By way of this exposure in FIG. 1c, and development of the 1813 photoresist with a type 351 developer in a 5 to 1 ratio mixture of distilled water to developer, an aperture 114 may be formed in the 1813 photoresist layer 104. A subsequent exposure using deep ultraviolet light as shown in FIG. 1*d* may be accomplished for the 2000 to 3000 angstroms PMGI photoresist in layer 102 using an exposure time of 400 to 600 seconds through the FIG. 1*d* aperture 114. Development of the PMGI photoresist may be accomplished using MicroChem 101 developer and a 45 second exposure to achieve the undercutting 116.

Figure 1F:
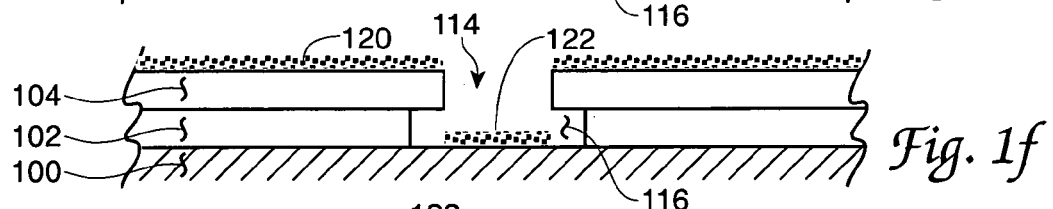
FIG. 1f shows a substrate with photoresist films and deposited metal usable in a repeating sequence part of a present invention process.
Figure 1G:
FIG. 1g shows a substrate with selected deposited metal area usable in a repeating sequence part of a present invention process.

In the FIG. 1*f* step of FIG. 1 an evaporated layer of Gold metal is shown to have been deposited over the exposed surfaces of the 1813 photoresist 104 at 120 and the exposed portion of the substrate 100 in the aperture 114 and 116 area; the metal 122 being in this latter position. This layer of Gold may have a thickness of about 2800 angstroms and is preferably preceded by a 200 angstroms film of chrome for substrate adhesion. The deposition is preferably accomplished by evaporation achieved under chamber pressure conditions of one to two millitorrs. As shown in the FIG. 1*g* drawing the metal at 122 is the sought after portion of this metal layer. Removal of the photoresist supported portions of the metal layer, the unwanted portions at 120, is preferably accomplished by way of a metal lift off sequence using standard adhesive coated tape that is followed by dissolution of the photoresist layers using acetone for the 1813 material of layer 104 and then using heated 1165 stripper for the PMGI material of layer 102. The 1165 stripper material is preferably used at a temperature of 90 to 100 degrees Celsius and is available commercially from MicroChem Corporation.

Figure 2:
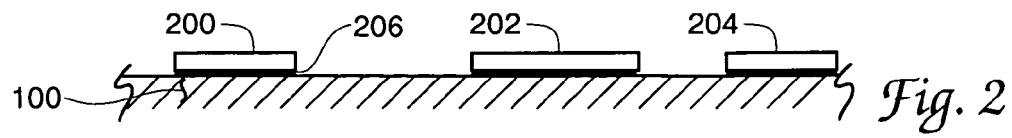
FIG. 2 shows a substrate with multiple deposited metal area pads usable in a present invention process.

The metal 122 achieved by way of the FIG. 1 sequence may be replicated in several locations across the surface of substrate 100 by way of providing a mask of appropriate size and configuration at 110 in FIG. 1*c*. Such a mask can provide simultaneous processing of multiple metal pads of similar or differing size and shape on the substrate. This metal may moreover be used for a variety of purposes in fabricating the sought-after MEMS switch. One collection of such metal areas is shown in the drawing of FIG. 2 herein where metal areas or metal pads 200, 202 and 204 have been formed in order to provide switch anchor, switch bottom actuation electrode and switch bottom contact functions respectively. The chrome metal used as a precursor for the Gold metal of pads 200, 202 and 204 is represented at 206 in the FIG. 2 drawing and by a similar showing in several subsequent drawings.

Figure 3:
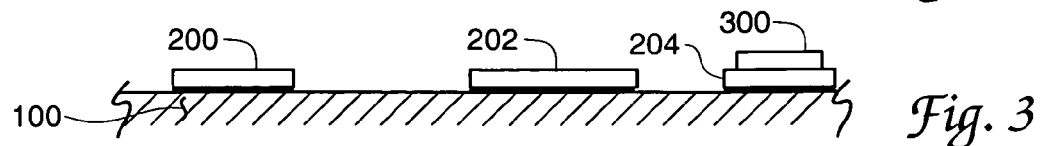
FIG. 3 shows a substrate with multiple deposited metal areas pads and a contact usable in a present invention process.

FIG. 3 in the drawings shows the addition of a film 300 of conformal additional metal on the surface of the bottom contact metal pad 204 of FIG. 2. This film 300 is preferably of about 500 angstroms thickness and is accomplished by way of a sputtering process using the above-described FIG. 1 sequence of steps, i.e., the subroutine processing steps. During this use of the FIG. 1 steps the metal evaporation of FIG. 1*f* is replaced by the sputtering sequence. This use of the FIG. 1 steps also includes the adhesive tape and solvent steps removal of portions of the metal 300 overlying the pads 200 and 202 and the intervening substrate 100 areas. The metal film 300 is preferably composed of a Gold alloy and is achieved under sputtering conditions involving chamber pressures of 2 to 5 millitorrs.

Figure 4:
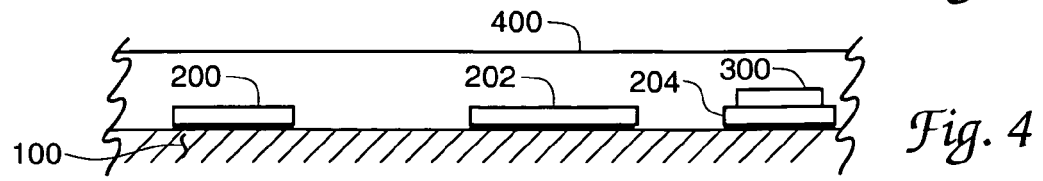
FIG. 4 shows a substrate with multiple deposited metal areas pads, a contact and a photoresist film usable in a present invention process.

The drawing of FIG. 4 shows the deposition of a photoresist film 400 over the FIG. 3 substrate 100 and pads 200, 202 and 204 structure. This photoresist film 400 is preferably composed of PMGI material of 2 to 3 micrometers thickness and achieved with the use of a conventional spinning and baking sequence involving two to three steps and about one nanometer per step. The film 400 is a sacrificial element in the present process and is additionally processed as is described in the ensuing paragraphs herein.

Figure 5:
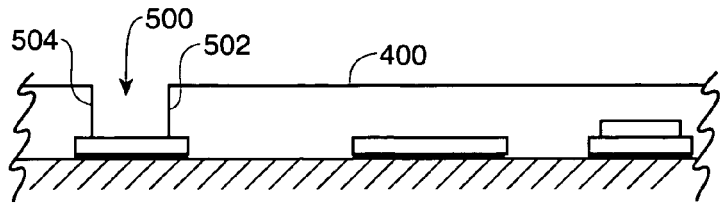
FIG. 5 shows a substrate with multiple deposited metal areas pads, a contact and a selectively modified photoresist film usable in a present invention process.

Mask patterning, exposure to deep ultraviolet light and development of the PMGI photoresist 400 in the region overlying the anchor pad 200 is represented in the FIG. 5 drawing.

Figure 6:
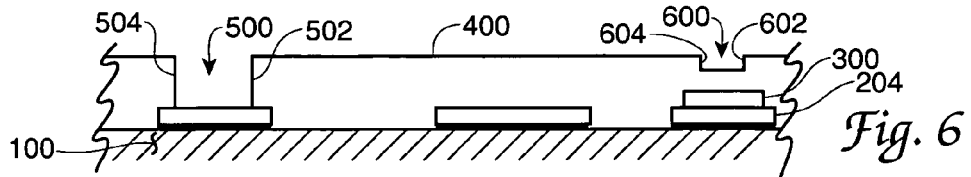
FIG. 6 shows a substrate with multiple deposited metal areas pads, a contact and a twice selectively modified photoresist film usable in a present invention process.

Notably the sidewalls 502 and 504 of the recess 500 in the developed photoresist film 400 are substantially vertical in disposition at this point in the processing. A similar mask patterning, exposure to deep ultraviolet light and development of the PMGI photoresist 400 in the region 600 overlying the lower switch contact pad 204 appears in the FIG. 6 drawing. Notably the sidewalls 602 and 604 of the recess 600 thusly formed in the photoresist film 400 are also substantially vertical in disposition at the FIG. 6 point in the switch processing. It is also significant to note that the exposure and the development for the recess 600 are each made to be of a partial nature and that the recess 600 is made to have a depth of about 0.7 to 1.2 micrometers as opposed to the greater substantially photoresist thickness depth of the recess 500. As a result of these differences between the recesses 500 and the recess 600, separate mask patterning, exposure to deep ultraviolet light and development of the PMGI photoresist 400 in the regions of these recesses is preferred. The partial nature of the exposure and the development for the recess 600 prepare for a subsequent processing step of this recess.

Figure 6A:
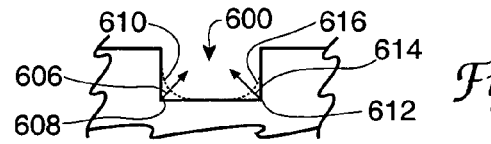
FIG. 6a shows how alterations of the FIG. 6 photoresist film occur.
Figure 7:
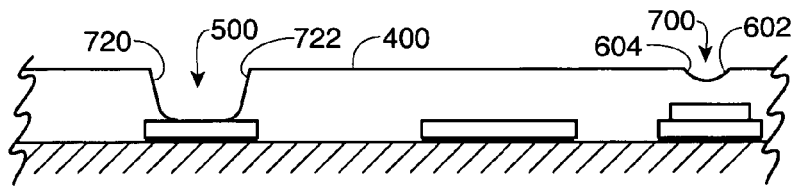
FIG. 7 shows accomplished alterations of the FIG. 6 photoresist film.

FIG. 7 in the drawings in fact shows the results of this subsequent processing step for both the recess 500 and the recess 600. The FIG. 7 changes represent in fact a significant aspect of the present invention. The processing represented in FIG. 7 actually involves a reflowing of the FIG. 6 PMGI photoresist 400 in order to enable the formation of a hinge element on the pad 200 in the recess 500 and a bulbous metal alloy contact in the recess 600 adjacent the pad 204. This reflowing is preferably accomplished thermally and involves subjecting the FIG. 6 photoresist and recesses to a bake at 250 degrees Celsius for a period of three to four minutes. One result of this thermal exposure is represented in the FIG. 6*a* cutaway drawing of the recess 600 region where the corners 608 and 612 of the recess 600 are shown to soften or recede along the arrows 606 and 614 toward the interior of the recess 600, to the extent of the lines 610 and 616. This change forms a bulbous or rounded dimple shape from the original square cornered recess 600. The nature of this bulbous or rounded dimple shape appears at 600 in the FIG. 6*a* and FIG. 7 drawings. Another result of this thermal exposure is represented by the sloping corners and the sloping walls 720 and 722 achieved in the recess 500 as is shown in FIG. 7.

Figure 8:
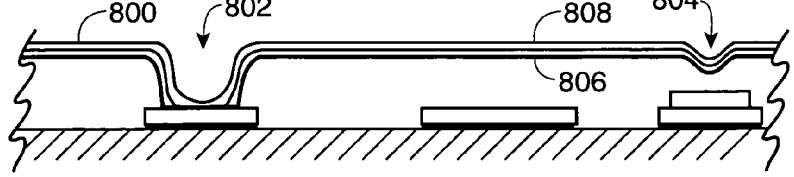
FIG. 8 shows addition of a metallic two layer thin film to the FIG. 7b structure.

The bulbous or rounded dimple shape at 600 and the sloping walls 720 in FIG. 7 are reproduced in a continuous sputtered layer of metal 800 over the photoresist 400 as appears in the FIG. 8 drawing. This metal preferably includes an initial layer 806 of Gold or Gold alloy of about 500 angstroms thickness, an intermediate thin layer of Gold 807, and a covering layer 808 of Titanium of about 200 angstroms thickness. These layers are preferably achieved through use of a standard sputtering process involving the pressures, of 2 to 3 millitorrs, and the times of 30 seconds and 1 minute for the Gold and the titanium layers. The Gold or Gold alloy layer serve as the electrical contact metal and the metal layer of Gold and Titanium at 800 serve as the seed layer for the electrical structural layer by which the movable element of the switch being fabricated can be later separated from its underlying structure of formation to permit movement between contact open and contact closed conditions during switch actuation. The metal layer 800 follows the contours of the bulbous or rounded dimple shape at 600 and the sloping walls 720 in FIG. 7 as appear at 802 and 804 in the FIG. 8 drawing.

Figure 9:
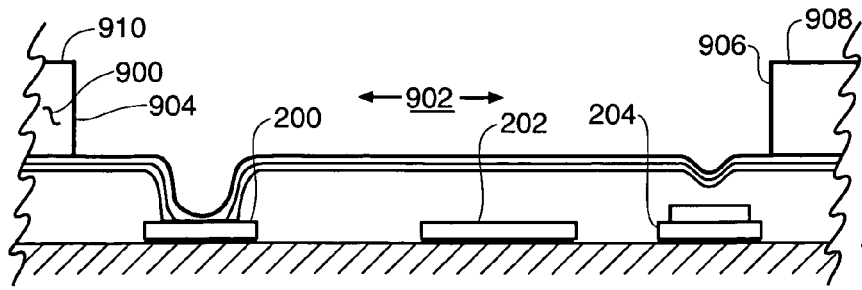
FIG. 9 shows addition of a modified photoresist layer to the FIG. 8 metallic two layer thin film structure.

FIG. 9 in the drawings shows the results of adding another layer 900 of photoresist of some 6 micrometers thickness over the Titanium metal of layer 800 in order to prepare for an ensuing electroplating process. The layer 900 is made of type 9260 photoresist, a photoresist formulation having the especially desirable high viscosity characteristic. The 9260 photoresist is available from the Ulm Germany corporation Microchemicals GmbH. The representation in FIG. 9 also shows the 9260 photoresist has been mask exposed, developed and etched away in the region overlying the anchor pad, actuation pad and contact pad 200, 202 and 204 respectively to leave the larger recess 902 in which an etching away of the now exposed and uppermost layer of Titanium 808 can be accomplished. Removal of the Titanium layer 808 can be accomplished with a buffered oxide etch diluted with de-ionized water (1:10) in a three to four minute etch. Following Titanium removal the Gold layer 806 remains in the recess 902 and together with the walls 904 and 906 of the etched 9260 photoresist forms a thick mold region in which electroplated metal may be received.

Figure 10:
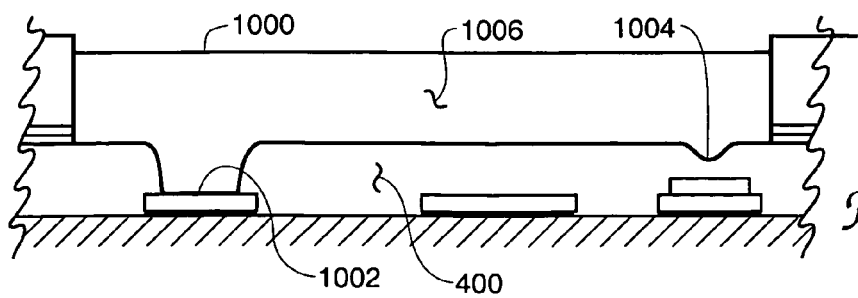
FIG. 10 shows addition of a limited metallic film to the FIG. 9 structure.

FIG. 10 in the drawings shows the receipt of Gold electroplate metal 1000 in a thickness of about 5 micrometers in the recess area 902. The existing Gold layer 806 has in fact provided a plating electrode with the aid of which the plated metal area 1000 can be formed. Notably the metal 1000 does not extend over the surfaces 908 and 910 of the 9260 photoresist since no such plating electrode is present in this location to attract the metal particles moving through a plating bath. It is notable that the plated metal 1000 extends down to the Gold layer of the anchor pad 200 and thus is able to form an intimate rigid interface with the anchor pad at 1002. It is notable also that the plated metal 1000, which is actually the movable element of the sought-after MEMS switch, is of 5 micrometers thickness and is fully surrounded by (but not covered by) photoresist material structures. The bulbous region 1004 of the plated metal 1000 is of course the desired rounded contact area of the movable switch element 1006.

Figure 11:
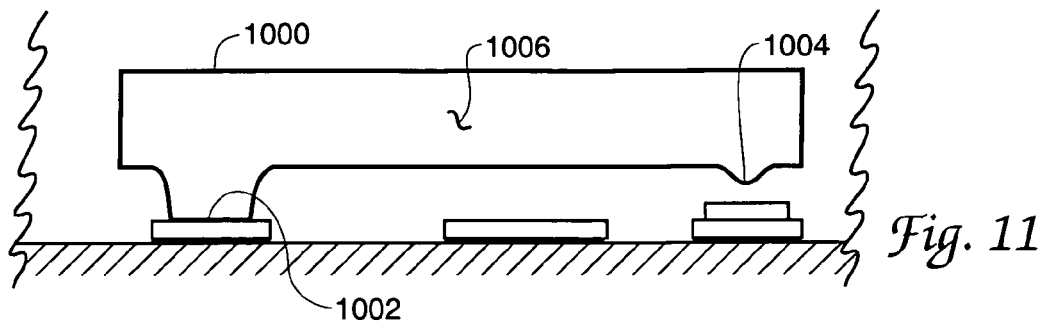
FIG. 11 shows a completed MEMS switch achieved from the FIG. 1-FIG. 10 sequence of steps.

Completion of the present process involves several additional steps including dissolving of the 9260 photoresist at each end of and adjacent the sides of the movable switch element 1006; this may be accomplished with use of acetone. Completion also involves etching away the FIG. 8 Titanium film 808 from areas adjacent the movable switch element 1006, i.e., from areas exposed by the just completed dissolution of the 9260 photoresist. This etching away may involve another use of a buffered oxide etch as accomplished in the cavity 902 in connection with the FIG. 9 step. Completion also involves etching away the FIG. 8 Gold film 806 from areas adjacent the movable switch element 1006, i.e., from the areas exposed by the dissolution of the 9260 photoresist and the etching away of the Titanium film from areas adjacent the movable switch element 1006. A final step in the process involves release the movable switch element 1006 by removing the underlying PMGI photoresist layer 400 using a 1165 stripper heated to 90 to 100 degrees Celsius in a gross dissolving step. A view of the completed MEMS switch appears in FIG. 11.

Figure 12:
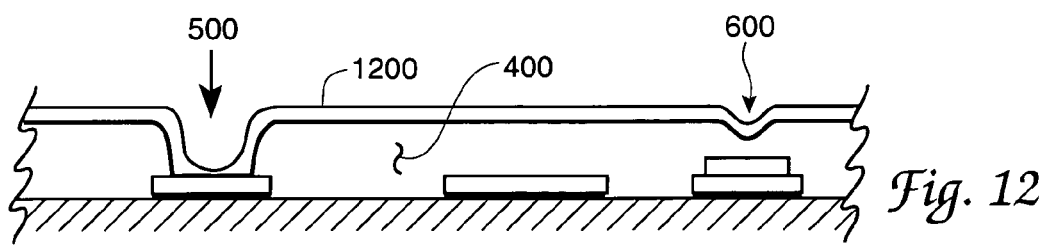
FIG. 12 shows an alternative arrangement of the FIG. 8 structure.

By way of slight modification of the thusly-described process it is possible to achieve a MEMS metal contact switch structure with metal alloy electrical contacts providing advantages in fabrication and performance as are somewhat described in the above identified companion patent document. Notably such an MEMS switch with alloy contacts is believed to be new to the MEMS switch art and provides longer switch lifetimes and better switch wear characteristics. This alloy related slight modification of the thusly-described sequence departs from the FIG. 1 through FIG. 11 process just after the FIG. 7 drawing and involves the alternate steps shown in the FIG. 12 through FIG. 14 drawings herein before returning to the FIG. 1 through FIG. 11 sequence commencing with the FIG. 9 step.

According to this modification of the described process a layer 1200 of alloy metal is deposited and patterned over the thermally reflowed photoresist 400 then the Gold and Titanium layers 806, 807 and 808 are deposited as described above in connection with FIG. 8. The gold alloy layer 1200 may be composed of Gold and Palladium, Gold and Platinum, Gold and Silver metals or of other alloy metal combinations as suggested in the companion patent document or composed of other herein unspecified alloys. As shown in the FIG. 12 drawing a thin film 1200 of such metal alloy, a film of about 500 angstroms thickness, preferably also achieved in a sputtering step, is formed over the photoresist layer 400 and again includes recesses of the 802 and 804 configuration. Sputtering conditions similar to those specified earlier herein may be used to form the film 1200.

Figure 13:
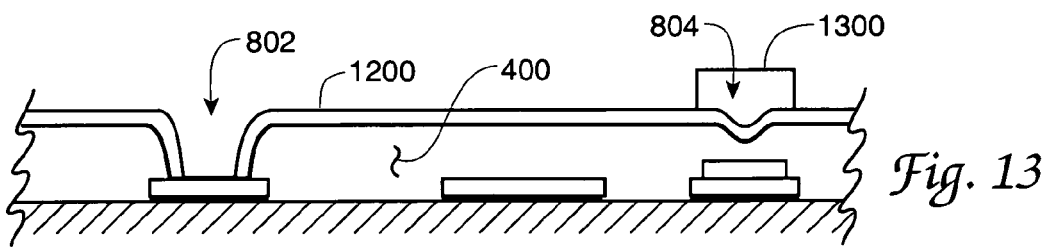
FIG. 13 shows a photoresist modification of the FIG. 12 structure.
Figure 14:
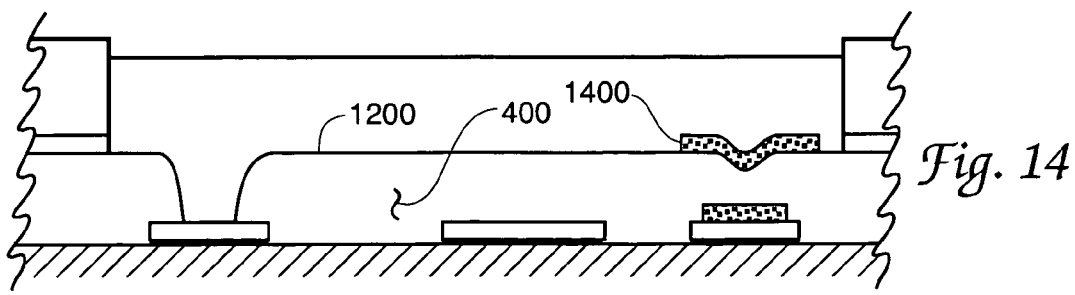
FIG. 14 shows a substitution of contact metal for the FIG. 13 photoresist area.

As suggested in the FIG. 13 drawing a second step series in the modified MEMS switch process involves the deposition, masking, developing and etching to achieve a limited photoresist area 1300 over the bulbous or rounded dimple area 804 in the thin film-covered photoresist 400. The area 1300 may be composed of type 1813 photoresist. After forming the area 1300 the exposed portions of the alloy film 1200 may be etched away and the area of this etching covered with photoresist in order to form a cavity in which a size-limited layer of contact alloy 1400 may be formed. The size-limited layer of contact alloy 1400 may be made of Gold alloy material and may have a dimension of 8 nanometers in diameter and may be of 500 angstroms thickness for examples.

Figure 15:
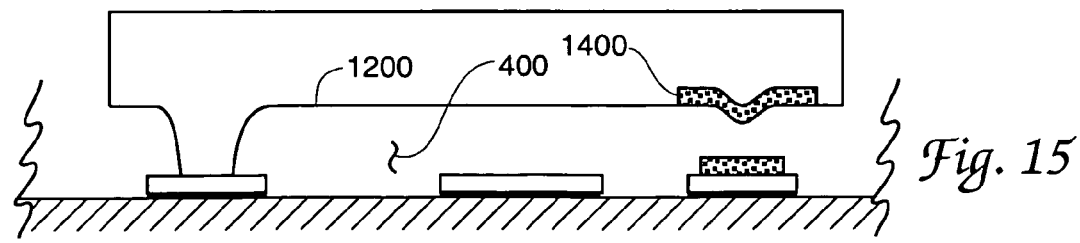
FIG. 15 shows a completed MEMS switch achieved from the FIG. 12-FIG. 14 modification sequence of steps.

Following formation of the contact area alloy 1400 the photoresist deposition and configuring to form a FIG. 9 cavity 902 for reception of plating metal 1000 and formation of the movable contact element 1006 may be accomplished. With presence of the cavity 902 the modified MEMS switch process may in fact be considered to have returned to the FIG. 1 through FIG. 11 sequence of steps for processing in the FIG. 10 manner. A cross sectional view of the alloy contact modified MEMS switch appears in the FIG. 15 drawing.

The MEMS switch described thus far in this document is of the single pole single throw normally open switch type. The present invention is not viewed as being limited to switches of this classification however and is believed to be extendable to double and triple throw arrangements also having the normally open characteristic. Extension of the described switch and process to a normally closed switch configuration is however viewed as entailing difficulties.

The thusly described switch formation sequence provides a switch having advantages over other procedures for MEMS switch formation; among these are:

the use of conventional integrated circuit materials and procedures, materials and procedures compatible with fabricating other solid state device elements of an electrical circuit, during switch formation;

the achievement of a rounded bulbous movable contact having desirably long operating life and low contact resistance;

the use of relatively low temperature processing steps such as photoresist baking and electroplating to accomplish switch formation;

the achievement of MEMS switches with an alloy electrical contact;

the achievement of MEMS switches with integral mechanical element and electrical contact portions.

the achievement of MEMS switches with desirable immunity to mechanical stiction and other switch mechanism difficulties.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. A method for making electrical contact elements for a radio frequency MEMS contact switch, said method comprising the steps of:
    fabricating a metallic anchor member, a metallic contact actuation electrode and a metallic lower contact support element for said radio frequency MEMS contact switch on a surface of an insulating substrate member;
    a first covering step comprising covering said metallic anchor member, said metallic contact actuation electrode and said metallic lower contact support element with a layer of sacrificial photoresist material;
    forming a selectively configured anchor member perturbation and a rectangularly configured moveable contact member precursor perturbation in said layer of sacrificial photoresist material;
    reflowing said layer of sacrificial photoresist material selectively configured anchor member perturbation and said rectangularly configured moveable contact member precursor perturbation into sloping sidewall and curving cross-section shapes by applying thereto an elevated temperature sequence having selected time and temperature magnitudes;
    a second covering step comprising covering said layer of sacrificial photoresist material including said sloping sidewall and curving cross-section shapes with a layer of intimately contacting movable contact-supporting metal of selected lateral extent;
    said selected lateral extent layer of movable contact-support metal including both a contact metal anchoring portion received on said selectively configured anchor member perturbation and a bulbous movable contact portion formed within an upper contact member precursor perturbation of said sacrificial photoresist material during said second covering step; and
    releasing said layer of intimately contacting movable contact-support metal and said bulbous movable contact portion from said layer of sacrificial photoresist material, said releasing enabling electrical movement control of said contact-support metal with said bulbous upper contact portion by influence of said contact actuation electrode.

2. The method for making electrical contact elements for a radio frequency MEMS contact switch of claim 1 wherein said step of fabricating a metallic anchor member, a metallic contact actuation electrode and a metallic lower contact support element for said MEMS radio frequency electrical switch includes use of a subroutine fabrication sequence having the steps of:
    successively covering an electrically insulating substrate member with first and second photoresist material layers;
    etching a mask selected first aperture in said second photoresist material layer;
    etching through said first aperture a second aperture in said first photoresist material layer to expose a selected portion of said substrate member;
    covering an exposed surface of said second photoresist material layer and said exposed portion of said substrate member with a metal film; and
    removing said first and second photoresist material layers and said metal film covered surface of said second photoresist material layer from said substrate member with a photoresist dissolving sequence.

3. The method for making electrical contact elements for a radio frequency MEMS contact switch of claim 2 wherein further includes an evaporated deposition of first and second metallic film layers onto said exposed portion of said substrate member.

4. The method for making electrical contact elements for a radio frequency MEMS contact switch of claim 3 wherein said second metallic film layer is comprised of Gold and said first metallic film layer is comprised of a Gold substrate adhesion metal film.

5. The method for making electrical contact elements for a radio frequency MEMS contact switch of claim 4 wherein said Gold substrate adhesion metal film is comprised of Chromium metal.

6. The method for making electrical contact elements for a radio frequency MEMS contact switch of claim 1 wherein said substrate is comprised of sapphire material.

7. The method for making electrical contact elements for a radio frequency MEMS contact switch of claim 1 wherein said method further includes a step of adding a layer of electrical contact metal over said metallic lower contact support element intermediate said fabricating and said covering steps.

8. The method for making electrical contact elements for a radio frequency MEMS contact switch of claim 1 wherein said first covering step sacrificial photoresist material layer is comprised of a PMGI photoresist material of two to three micrometers thickness.

9. The method for making electrical contract elements for a radio frequency MEMS contact switch of claim 1 wherein said selectively configured anchor member precursor perturbation extends totally through said sacrificial photoresist material to said metallic anchor member.

10. The method for making electrical contact elements for a radio frequency MEMS contact switch of claim 1 wherein said rectangularly configured moveable contact member precursor perturbation extends only partially through said layer of sacrificial photoresist material and has a depth of between 0.7 and 1.2 micrometers.

11. The method for making electrical contact elements for a radio frequency MEMS CONTACT switch of claim 1 wherein said reflowing step elevated temperature time and temperature magnitudes include 250 degrees Celsius for a time between three and four minutes.

12. The method for making electrical contact elements for a radio frequency MEMS contact switch of claim 2 wherein said second covering step includes an electroplating deposition of metal inclusive of a thin film metallic covering over said sacrificial photoresist material.

13. The method for making electrical contact elements for a radio frequency MEMS contact switch of claim 12 wherein said second covering step electroplating deposition includes metallic Gold material.

14. The method for making electrical contact elements for a radio frequency MEMS switch of claim 1 wherein said releasing step includes use of a photoresist stripping agent operating at a temperature above room temperature.

* * * * *